(12) United States Patent
Gambino et al.

(10) Patent No.: US 9,362,229 B2
(45) Date of Patent: Jun. 7, 2016

(54) SEMICONDUCTOR DEVICES WITH ENHANCED ELECTROMIGRATION PERFORMANCE

(71) Applicant: INTERNATIONAL BUSINESS MACHINES CORPORATION, Armonk, NY (US)

(72) Inventors: Jeffrey P. Gambino, Westford, VT (US); David L. Harame, Essex Junction, VT (US); Baozhen Li, South Burlington, VT (US); Timothy D. Sullivan, Underhill, VT (US); Bjorn K. A. Zetterlund, Bolton, MA (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/515,925

(22) Filed: Oct. 16, 2014

(65) Prior Publication Data
US 2015/0035158 A1 Feb. 5, 2015

Related U.S. Application Data

(62) Division of application No. 13/674,498, filed on Nov. 12, 2012, now Pat. No. 8,901,738.

(51) Int. Cl.
H01L 23/528 (2006.01)
H01L 23/532 (2006.01)
H01L 21/768 (2006.01)
H01L 23/522 (2006.01)

(52) U.S. Cl.
CPC .... *H01L 23/53238* (2013.01); *H01L 21/76843* (2013.01); *H01L 23/528* (2013.01); *H01L 23/5226* (2013.01); *H01L 2924/0002* (2013.01)

(58) Field of Classification Search
CPC .............. H01L 23/532; H01L 23/528; H01L 23/53238
USPC ......................... 257/773, 350, 738, 765, 775
See application file for complete search history.

(56) References Cited

U.S. PATENT DOCUMENTS

| 5,382,831 | A | 1/1995 | Atakov et al. |
| 5,760,476 | A | 6/1998 | Varker et al. |
| 6,191,481 | B1 | 2/2001 | Bothra et al. |
| 6,329,719 | B1 | 12/2001 | Nakamura |
| 6,548,902 | B2 | 4/2003 | Suzuki et al. |
| 7,078,817 | B2 | 7/2006 | Ho et al. |
| 7,339,274 | B2 | 3/2008 | Desko, Jr. et al. |
| 7,414,275 | B2 | 8/2008 | Greenberg et al. |

(Continued)

OTHER PUBLICATIONS

Hu et al. "Electromigration challenges for nanoscale Cu wiring", IAP Conference, 2008, 9 pages.

*Primary Examiner* — Chuong A Luu
*Assistant Examiner* — Rodolfo Fortich
(74) *Attorney, Agent, or Firm* — Anthony Canale; Andrew M. Calderon; Roberts Mlotkowski Safran & Cole, P.C.

(57) ABSTRACT

Semiconductor devices with enhanced electromigration performance and methods of manufacture are disclosed. The method includes forming at least one metal line in electrical contact with a device. The method further includes forming at least one staple structure in electrical contact with the at least one metal line. The at least one staple structure is formed such that electrical current passing through the at least one metal line also passes through the at least staple structure to reduce electromigration issues.

9 Claims, 5 Drawing Sheets

(56) References Cited

U.S. PATENT DOCUMENTS

| | | |
|---|---|---|
| 7,667,328 B2 | 2/2010 | Stamper et al. |
| 8,138,603 B2 | 3/2012 | Hsu et al. |
| 2007/0284662 A1 | 12/2007 | Chinthakindi et al. |
| 2008/0017989 A1 | 1/2008 | Lee et al. |
| 2009/0164964 A1 | 6/2009 | Stamper et al. |
| 2009/0294973 A1 | 12/2009 | Chanda et al. |
| 2009/0302476 A1 | 12/2009 | Li |
| 2010/0133700 A1* | 6/2010 | Werner et al. ............... 257/774 |
| 2010/0327445 A1 | 12/2010 | Filippi et al. |
| 2011/0037096 A1 | 2/2011 | Dunn et al. |
| 2011/0101534 A1 | 5/2011 | Stamper |
| 2011/0193199 A1* | 8/2011 | Filippi et al. ............... 257/621 |

* cited by examiner

SEMICONDUCTOR DEVICES WITH ENHANCED ELECTROMIGRATION PERFORMANCE

FIELD OF THE INVENTION

The invention relates to semiconductor structures and, more particularly, to semiconductor devices with enhanced electromigration performance and methods of manufacture.

BACKGROUND

The demand for high performance in bipolar transistors requires a copper interconnect to carry high current density and also work at high temperatures. This places severe challenges on copper interconnect reliability, especially concerning electromigration issues. Electromigration decreases the reliability of integrated circuits (ICs), with eventual loss of connections or failure of the circuit. Also, with increasing miniaturization, the probability of failure due to electromigration increases in very-large-scale integration (VLSI) and ultra-large-scale integration (ULSI) circuits because both the power density and the current density increase. Thus, as the structure size in ICs decreases, the practical significance of the electromigration effect increases.

In advanced semiconductor manufacturing processes, copper has replaced aluminum as the interconnect material of choice. Despite its greater fragility in the fabrication process, copper is intrinsically less susceptible to electromigration. However, electromigration continues to be an ever present challenge to device fabrication.

Some research has lead to simply widening metal lines in order to address electromigration issues. However, this is not satisfactory, particularly for VSLI and ULSI circuits. For example, increasing metal line width can only increase the current carrying capability, linearly, while the high junction temperature degrades the current carrying capability exponentially. Furthermore, using metal lines much wider than the device contact will have current crowding issues and device density issues. Also, a high temperature gradient along the interconnect can cause thermal migration and stress migration problems.

Accordingly, there exists a need in the art to overcome the deficiencies and limitations described hereinabove.

SUMMARY

In an aspect of the invention, a method comprises forming at least one metal line in electrical contact with a device. The method further comprises forming at least one staple structure in electrical contact with the at least one metal line. The at least one staple structure is formed such that electrical current passing through the at least one metal line also passes through the at least staple structure to reduce electromigration issues.

In an aspect of the invention, a method of forming a structure comprises forming a last wiring layer in a dielectric layer, in electrical contact with a transistor formed in a lower layer of the structure. The method further comprises forming at least one via hole in the dielectric layer, exposing the last wiring layer. The method further comprises forming at least one trench in the dielectric layer and over the at least one via hole. The method further comprises lining the at least one via hole and the at least one trench with conductive liner material. The method further comprises filling the at least one via hole and the at least one trench with conductive material such that the at least one via hole forms at least one conductive via and the at least one trench forms a conductive bar structure in direct electrical contact with the at least one conductive via. Electrical current flowing in the last wiring layer can also flow through the at least one conductive via and the conductive bar structure to mitigate electromigration effects in the last wiring layer.

In an aspect of the invention, a structure comprises a last metal line in electrical contact with an underlying device, and at least one staple structure in direct electrical contact with the last metal line. The at least one staple structure reduces electromigration issues in the last metal line.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a hetero-junction bipolar transistor with enhanced electromigration performance, which comprises the structures of the present invention. In still further embodiments, a method in a computer-aided design system is provided for generating a functional design model of the hetero-junction bipolar transistor with enhanced electromigration performance. The method comprises generating a functional representation of the structural elements of the hetero-junction bipolar transistor with enhanced electromigration performance.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIG. 1b shows a top down view of the structures of FIG. 1a;

DETAILED DESCRIPTION

The invention relates to semiconductor structures and, more particularly, to semiconductor devices with enhanced electromigration performance and methods of manufacture. More specifically, the present invention is directed to a hetero-junction bipolar transistor with enhanced electromigration performance and methods of manufacture. Advantageously, the present invention provides a low cost solution to enhance the copper interconnect electromigration performance to meet bipolar transistor needs, e.g., copper interconnects carrying high current density and working at high temperatures.

In embodiments, the present invention modifies a copper/cap interface to significantly slow down Cu diffusion by the combination of a modified Cu layer with periodical via bars. In more specific embodiments, the device of the present invention will mitigate electromigration effects by using a series of vias connected to a bar (or series of bars), capped and connected at their ends in a staggered fashion. A distance between the vias is shorter than a Blech length. As should be understood, the Blech length is a lower limit for the length of the interconnect that will allow electromigration to occur. Any wire that has a length below this limit will not fail by electromigration. In this way, the present invention creates blocking zones thereby enhancing electromigration performance, e.g., decreasing void formation in the lower wiring line. In embodiments, the combination of the vias (lined and filled with conductive material) and connected bars (lined and filled with conductive material), for example, will reduce resistance in the underlying metal line.

As should be understood by those of skill in the art, the Cu fast diffusion path for electromigration (EM) and stress migration (SM) is along a top surface of a structure, due to the relatively weaker Cu/cap adhesion. By modifying a portion of the Cu cap interface to a Cu/Ta interface, for example, those portions can serve as EM blocking zones. By making the distance between the neighboring EM blocking zones shorter than the Blech length, e.g., a lower limit for the length of the interconnect that will allow EM to occur, it is possible to increase the EM and SM performance. Advantageously, this solution should have minimal impact on Cu electrical resistivity. More importantly, by taking advantage of the Blech effect through those blocking zones formed by the contacts between the staple shaped structures and the metal line below, the electromigration performance degradation with temperature can be significantly reduced.

Figure 1A:
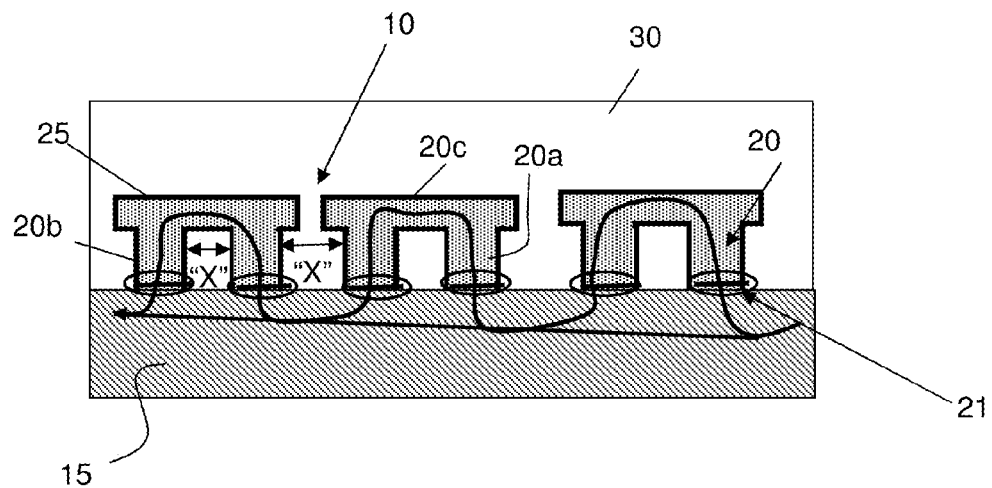
FIG. 1a shows a side view of structures and respective processing steps in accordance with aspects of the present invention.
Figure 1B:
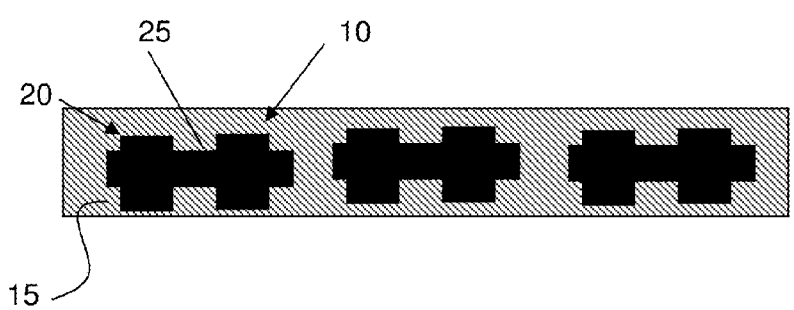

FIGS. 1a-1b show structures and respective processing steps in accordance with aspects of the present invention. Specifically, FIG. 1a shows a side view of the structures in accordance with aspects of the present invention; whereas, FIG. 1b shows a top down view of the structures of FIG. 1a. As shown in FIGS. 1a and 1b, in embodiments, the present invention includes a plurality of staple shaped structures 10 connected to an underlying metal line 15. In embodiments, the plurality of staple shaped structures 10 comprise vias 20 connected at one end to the metal line 15 and another end to a bar structure 25, e.g., spanning adjacent vias 20. That is, the bar structures 25 shown in FIGS. 1a and 1b are connected to two vias 20. The staple shaped structures 10 can be embedded in a dielectric material 30, at preferably a top level of a device, and be comprised of conductive material (with a conductive liner).

As shown in FIG. 1a, blocking zones 21 are provided at the interface of the stapled shaped structure and the metal line 15. This blocking zone can effectively shut down the electromigration due to the length between vias being less than the Blech length, e.g., by making the distance between the neighboring blocking zones shorter than the Blech length, it is possible to increase the EM and SM performance. These blocking zones 21 are provided in each of the embodiments. Also, as shown, electrical current, depicted by the arrow, will pass through the staple shaped structures 10 and metal line 15. In this way, the effects of any EM issues can be mitigated. This same concept is applicable to all of the embodiments of the present invention, e.g., allowing current to pass through structures (e.g., staple shaped structures 10 or other structures as shown and described herein) in order to reduce EM issues in the last wiring layer, at a top of the structure.

In embodiments, the vias 20 and bar structures 25 can be formed with copper material 20a, and lined with a conductive material 20b. In embodiments, the lining 20b can be, for example, tantalum, nitride or ruthenium formed in a via hole and trench in a same lining process. It should be understood by those of skill in the art, though, that other conductive material may also be used as the liner 20b in order to reduce the overall line resistance of the metal line 15. In embodiments, the distance "X" between each of the vias 20 is less than the Blech length. The bar structures 25 and the metal lines 15 can be capped with a non-conductive material 20c, e.g., SiN or SiCN. In embodiments, this cap material can extend across several bar structures 25 along an entire top layer of a dielectric material. The cap layer protects the Cu from oxidation and is important for ensuring reliability.

In embodiments, the staple shaped structures 10 can be manufactured in a number of ways using a number of different tools. In general, though, the methodologies and tools used to form the staple shaped structures 10 are adopted from integrated circuit (IC) technology. For example, the fabrication of the staple shaped structures 10 uses three basic building blocks: (i) deposition of material, (ii) applying a patterned mask on top of the material by photolithographic imaging, and (iii) etching the material selectively to the mask. The processes to form the staple shaped structures 10 can either be a single or dual damascene process.

More specifically, in embodiments, a metal wiring layer can be formed in a dielectric layer using damascene processing. A trench for the metal wiring layer can be patterned in the dielectric layer using conventional lithography and etching (e.g., reactive ion etching (RIE)) processes. The trench is then coated with a barrier layer, such as sputtered TaN/Ta, a seed layer, such as sputter Cu, and is filled the rest of the way with electroplated Cu. The excess metal is removed by chemical mechanical polishing (CMP). A dielectric capping layer such as SiN or SiCN is deposited to passivate the Cu surface.

A dielectric layer 30 can be formed on the metal line 15 using, e.g., CVD processes. The dielectric layer 30 can be, for example, an oxide based material. A plurality of vias and respective trenches are patterned in the dielectric layer 30 using conventional dual damascene lithography processes, e.g., forming a resist on the metal line 15, exposing the resist to energy (light) to form a pattern (openings), and etching the dielectric layer through the openings to form via holes and a corresponding trench. In embodiments, the via holes will expose portions of the metal line 15, e.g., last wiring layer, and the trenches are formed in alignment with respective ones of the via holes. In embodiments, the etching can be any conventional RIE process used in a dual damascene process.

A lining material 20b is deposited in the via hole and trench using any conventional deposition methodologies including, for example, sputter deposition, CVD, plasma enhanced CVD (PECVD), atomic layer CVD (ALCVD), etc. This liner 20b can be, for example, any conductive material that will improve the electromigration lifetime of the metal line 15, e.g., tantalum, tantalum nitride or ruthenium. The liner 20b can be formed in the via holes and the trench in a same deposition process. The thickness of the liner is 3 to 100 nm, with a preferable thickness of 10 nm. A copper material 20a is then formed over the liner 20b in the via holes and trenches, using conventional deposition methods. The copper material 20a can be used to form the conductive vias 20 and the bar structures 25, which span the vias 20. The copper material can then be planarized, for example, using a conventional chemical mechanical polish (CMP). A cap or liner 20c can be formed over the copper material 20, forming the bar structure 25. The cap or liner 20c can be formed from, e.g., SiN or SiCN. In embodiments, the cap or liner 20c can span across several of the bar structures 25, e.g., over the dielectric layer between adjacent bar structures.

Figure 2:
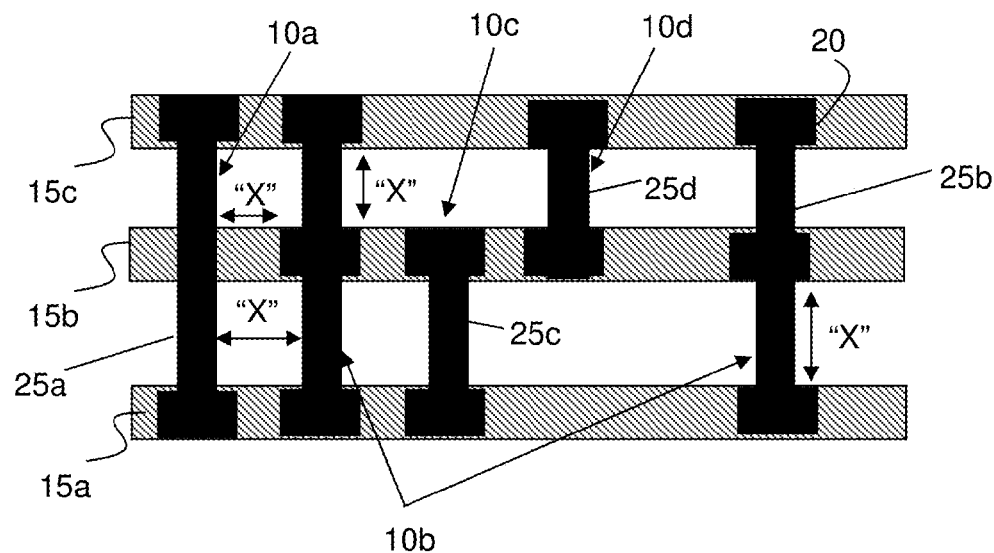
FIG. 2 shows alternative arrangements of structures shown in FIGS. 1a and 1b, and respective processing steps in accordance with aspects of the present invention.

FIG. 2 shows alternative arrangements of structures shown in FIGS. 1a and 1b, and respective processing steps in accordance with aspects of the present invention. Specifically, the alternative arrangement of structures of the present invention includes a plurality of staple shaped structures 10a, 10b, 10c, and 10d spanning and in electrical contact with different combinations of metal lines 15a, 15b and 15c. It should be understood by those of skill in the art that a specific arrangement of the plurality of metal lines 15a, 15b and 15c and staple shaped structures 10a, 10b, 10c, and 10d is provided for illustrative purposes only, and that more or less structures in various combinations and arrangements are also contemplated by the present invention. It should also be understood by those of ordinary skill in the art that the plurality of metal lines 15a, 15b and 15c and staple shaped structures 10a, 10b, 10c, and 10d can be formed using similar fabrication processes as already described herein, such that no further explanation is required. Additionally, by implementing the staple shaped structures 10a, 10b, 10c, and 10d, electrical current can pass through the structures and any of the respective metal lines 15a-15c, in order mitigate the effects of EM issues.

In FIG. 2, each of the staple shaped structures 10a, 10b, 10c, and 10d and respective vias or combinations thereof are spaced at a distance "X", which is less than the Blech length. Also, each of the staple shaped structures 10a, 10b, 10c, and 10d include a respective bar structure 25a, 25b, 25c, and 25d connected electrically to a combination of metal lines (e.g., metal lines 15a, 15b and/or 15c) by a respective via 20. It should be understood that any combination or arrangement of the bar structures spanning over and/or in electrical contact with the metal lines is contemplated by the present invention, and that FIG. 2 is merely representative of a single arrangement. For example, FIG. 2 shows:

(i) the staple shaped structure 10a electrically coupled to metal lines 15a and 15c;
(ii) the staple shaped structure 10b electrically coupled to metal lines 15a, 15b and 15c;
(iii) the staple shaped structure 10c electrically coupled to metal lines 15a and 15b; and
(iv) the staple shaped structure 10d electrically coupled to metal lines 15b and 15c.

In these embodiments, electrical current can pass through the staple shaped structures 10a, 10b, 10c, and 10d to mitigate the effects of EM issues. Also, blocking zones are provided at the interface of the stapled structures 10a-10d and the respective metal line. This blocking zone can effectively shut down the electromigration due to the length between vias being less than the Blech length, e.g., by making the distance between the neighboring blocking zones shorter than the Blech length, it is possible to increase the EM and SM performance.

In more specific detail, the staple shaped structure 10a comprises a conductive bar structure 25a spanning over the metal lines 15a, 15b and 15c, and in electrical contact with the vias 20 formed directly on metal lines 15a and 15c. In further embodiments, the staple shaped structure 10b comprises a conductive bar structure 25b spanning over metal lines 15a, 15b and 15c, and in electrical contact with the vias 20 formed directly on each of the metal lines 15a, 15b and 15c. In further embodiments, the staple shaped structure 10c comprises a conductive bar structure 25c spanning between the metal lines 15a and 15b, and in electrical contact with the vias 20 formed directly on the metal lines 15a and 15b. In further embodiments, the staple shaped structure 10d comprises a conductive bar structure 25d spanning between the metal lines 15b and 15c, and in electrical contact with the vias 20 formed directly on the metal lines 15b and 15c.

Still referring to FIG. 2, as should be understood by those of skill in the art, each of the staple shaped structures are in electrical contact with a respective metal line through the conductive vias 20, in the combinations described above. Also, each of the conductive bar structures and conductive vias can be lined with the liner material as described with reference to FIGS. 1a and 1b. Also, each of the bar structures can be capped with the capping material, e.g., SiN.

Figure 3:
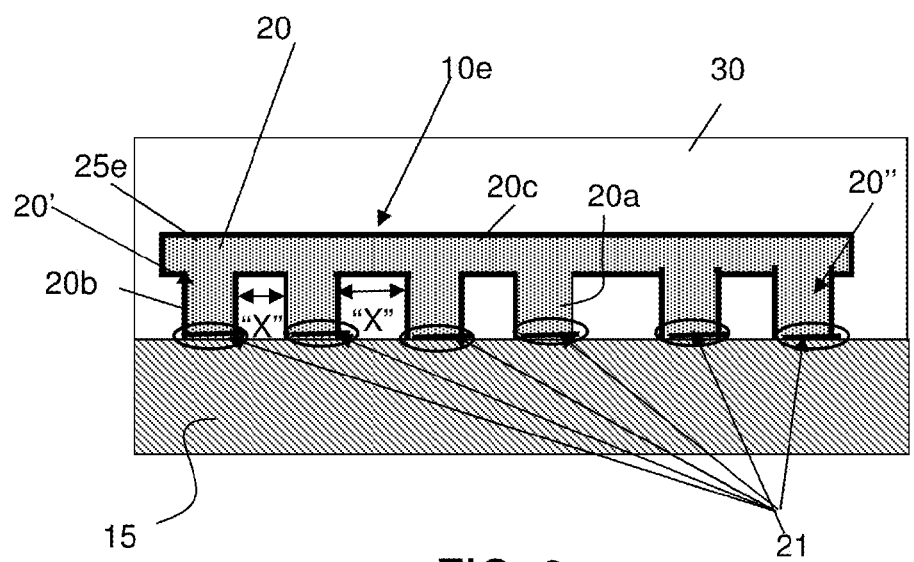
FIG. 3 shows a structure and respective processing steps in accordance with additional aspects of the present invention.
Figure 4:
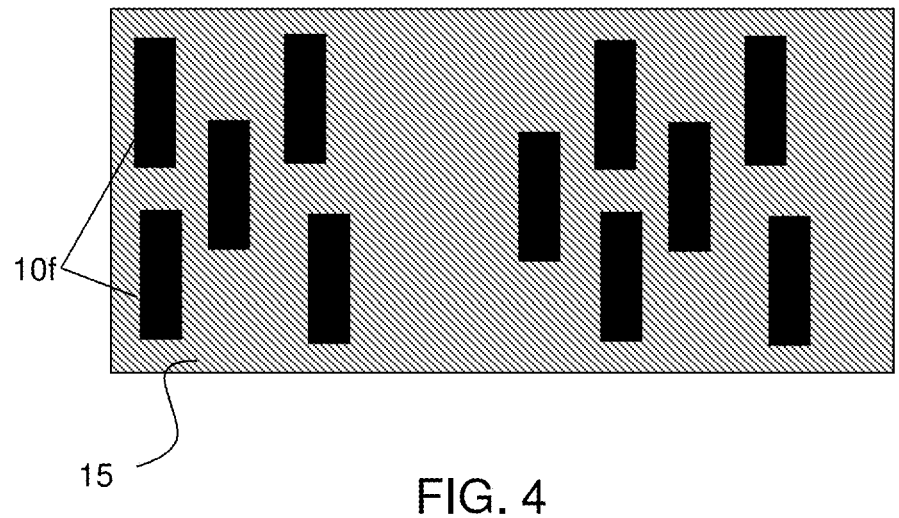
FIG. 4 shows a top down view of an alternative arrangement of structures and respective processing steps in accordance with aspects of the present invention.

FIG. 3 shows a structure and respective processing steps in accordance with additional aspects of the present invention. In this embodiment, a staple shaped structure 10e comprises a bar structure 25e electrically connected to several vias 20 on a single metal line 15. In this embodiment, the bar structure 25e is shown to be connected to six (6) vias; although any number of vias are contemplated by the present invention. In embodiments, the added vias 20 decrease the resistance to the top of the structure and divert more current through the upper level, further decreasing the current flowing in the segment of the bottom line (e.g., metal line 15) between ends, e.g., vias 20' and 20", of the staple structure 10e. As in each of the embodiments, the vias 20 and the bar structure 25e can be filled with a conductive material 20a and lined with a liner material 20b to reduce the overall line resistance of the metal line 15. The vias are preferably at least spaced less than the Blech length. Also, the bar structure 25e can be capped with a liner material 20c, e.g., SiN. In embodiments, the liner material 20c can be extended completely or partially across the top of the structure (as with any of the embodiments). Blocking zones 21 are provided at the interface of the vias and the metal line 15. This blocking zone can effectively shut down the electromigration due to the length being less than the Blech length, e.g., by making the distance between the neighboring blocking zones shorter than the Blech length, it is possible to increase the EM and SM performance FIG. 4 shows a top down view of an alternative arrangement of structures and respective processing steps in accordance with aspects of the present invention. For example, FIG. 4 shows several staple shaped structures 10f staggered on a wide copper line 15 to enhance its EM performance. The staple shaped structures 10f can be provided in a plurality of different arrangements, one of which is shown in FIG. 4. For example, in embodiments, each of the staple shaped structures 10f can be staggered at intervals of about 10 um apart so as to not impact the wiring for the upper level.

As in the other embodiments, blocking zones are provided at the interface of the stapled shaped structures and the metal line 15. Also, as in the previously described embodiments, electrical current can pass through each of the staple shaped structures 10f to mitigate the effects of EM issues. Also, as in the previous embodiments, each of the staple shaped structures 10f can comprises a less conductive bar structure electrically connected to conductive vias on a single metal line 15, each of which are lined.

In the embodiment of FIG. 4, there are eleven (11) staple shaped structures 10f positioned at staggered locations on a single wide copper line 15; although other arrangements are also contemplated by the present invention. In embodiments, the staggering of the staple shaped structures 10f can effectively shut down Cu diffusion along the top surface of the structure. The staple shaped structures 10f are formed in the manner already described herein, such that no further explanation is required for an understanding of the present invention.

Figure 5:
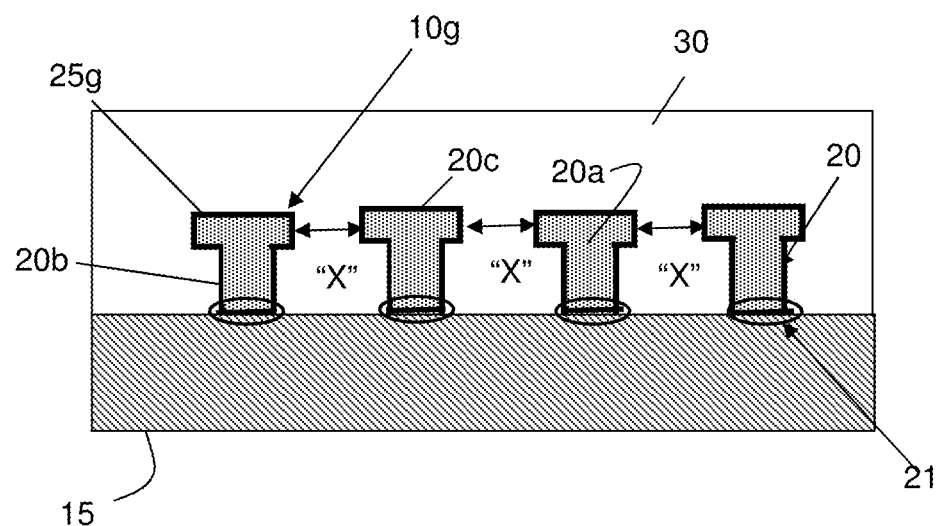
FIG. 5 shows structures and respective processing steps in accordance with additional aspects of the present invention.

FIG. 5 shows structures and respective processing steps in accordance with additional aspects of the present invention. As shown in FIG. 5, in embodiments, the present invention includes a plurality of "T" shaped structures 10g connected to an underlying metal line 15. In embodiments, the plurality of "T" shaped structures 10 g comprise vias 20 connected at one end to the metal line 15 and another end to a bar structure 25g. In this embodiment, the bar structure 25g is only connected to a single via 20. The "T" shaped structures 10 g can be embedded in a dielectric material 30, at preferably a top level of the structure.

In embodiments, the vias 20 and bar structures 25g can be formed with copper material 20a, and lined with a conductive material 20b, as already described herein. For example, in embodiments, the lining 20b can be, for example, tantalum, nitride or ruthenium. It should be understood by those of skill in the art, though, that other conductive material may also be used as the lining 20b in order to reduce the overall line resistance of the metal line 15. The bar structures 25g can be capped with a conductive material 20c, e.g., SiN or material similar to the liner 20b. In embodiments, the distance "X" between each of the vias 20 and/or bar structures 25g is less than the Blech length. In embodiments, the "T" shaped structures 10g can be formed using conventional methodologies and tools as described with reference to FIGS. 1a-4, such that no further explanation is required herein. Again, in this embodiment, blocking zones 21 are provided at the interface of the "T" shaped structures and the metal line 15.

Figure 6:
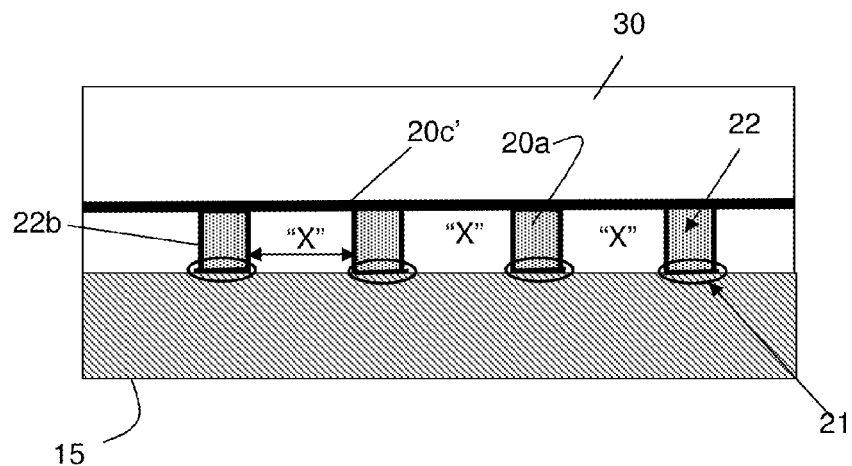
FIG. 6 shows a structure and respective processing steps in accordance with additional aspects of the present invention.

FIG. 6 shows a structure and respective processing steps in accordance with additional aspects of the present invention. As shown in FIG. 6, in embodiments, the present invention includes a plurality of via structures 22 connected to an underlying metal line 15. In embodiments, the via structures 22 are formed by lining a via with a CuMn seed layer 22b, and then filling the via structure 22 with copper material 20a. Once the vias are filled and, if necessary planarized using a CMP process, a cap layer 20c' can be formed over the structures. In embodiments, the cap layer 20c' can be, for example, SiN, formed using conventional CVD processes. In embodiments, this cap layer 20c' can extend across the via structure 22 and any dielectric material 30 therebetween. Thereafter, additional dielectric layer 30 can be deposited on the cap layer 20c'. As in the previous embodiments, the via structures 22, cap layer 20c and other structures can be formed using conventional lithography, etching and deposition processes, known to those of skill in the art. In embodiments, using CuMn seed layer for the line below provides additional improvements for electromigration performance.

Figure 7:
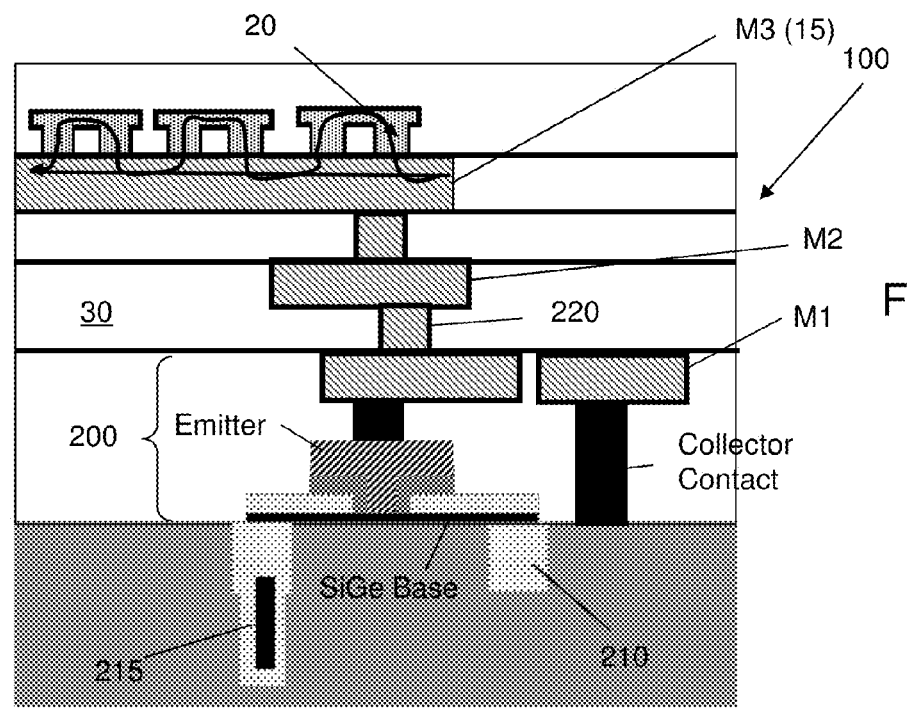
FIG. 7 shows a hetero-junction bipolar transistor with enhanced electromigration performance, implementing structures according to aspects of the present invention.

FIG. 7 shows a hetero-junction bipolar transistor with enhanced electromigration performance by implementing structures according to aspects of the present invention. More specifically, FIG. 7 shows a structure 100 comprising a hetero-junction bipolar transistor 200. In embodiments, the hetero-junction bipolar transistor 200 comprises a SiGe base, an emitter and collector contact, in addition to shallow trench isolation structures (STI) 210 and deep trench isolation structure 220, all of which are fabricated using known processes.

As further shown in FIG. 7, the structure 100 also includes several wiring layers, M1-M3 (although other wiring layers are also contemplated by the present invention), with M3 being representative of a last wiring layer, e.g., metal line 15. The wiring layers M1-M3 are connected to one another by metal vias 215. The wiring layers M1-M3 and the vias 220 are formed in dielectric layers 30, e.g., oxide. As shown in the representative structure, the last metal line (e.g., M3 or metal line 15) is electrically coupled to the structures 10 of the present invention. In this way, electromigration (EM) issues are mitigated in the last metal line that would otherwise result in high current density in the emitter and high temperature operations.

Figure 8:
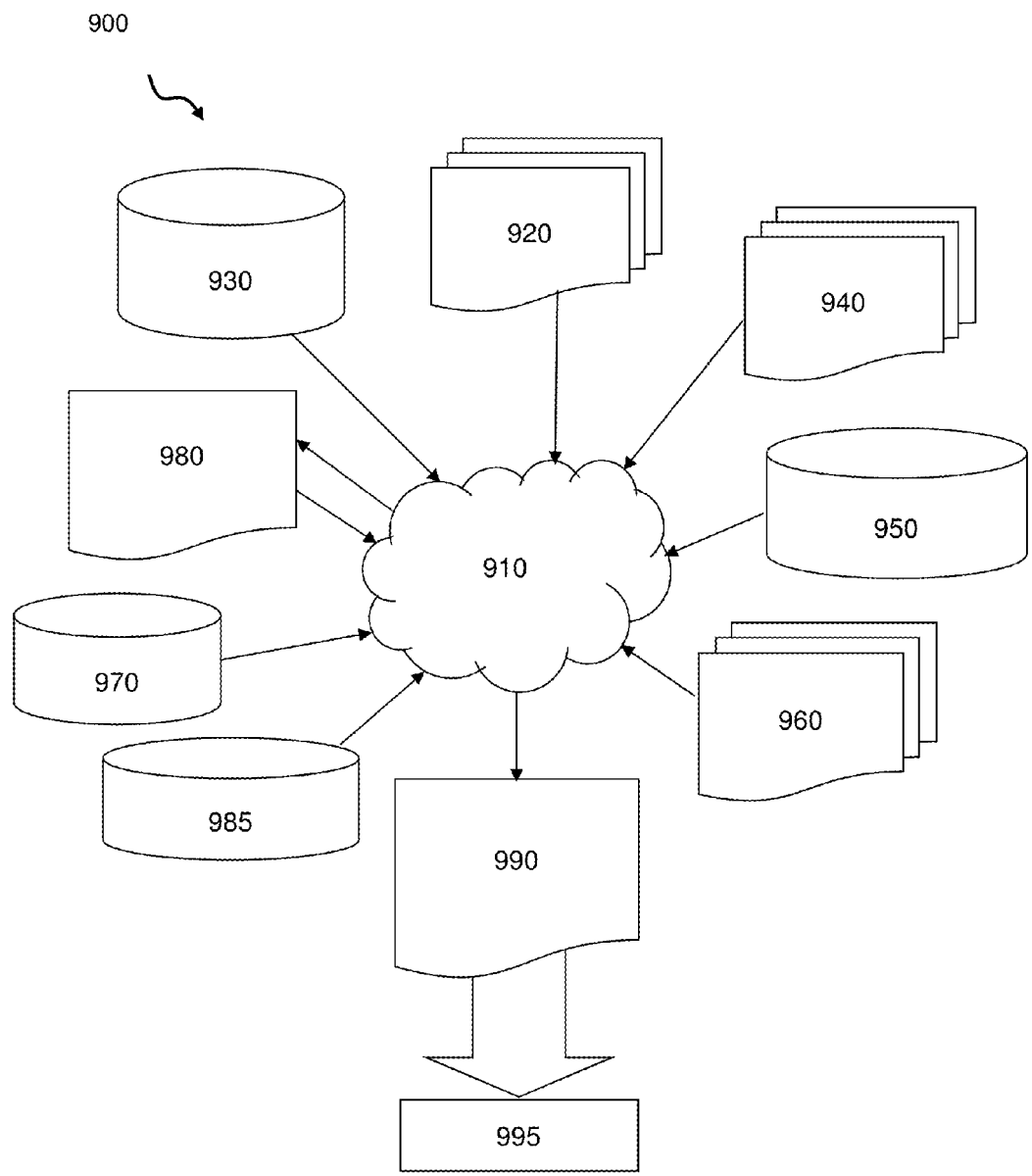
FIG. 8 is a flow diagram of a design process used in semiconductor design, manufacture, and/or test.

FIG. 8 is a flow diagram of a design process used in semiconductor design, manufacture, and/or test. FIG. 8 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1a and 1b-7. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1a and 1b-7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1a and 1b-7 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1a and 1b-7. In one embodiment, design structure 990 may comprise a compiled, executable HDL simulation model that functionally simulates the devices shown in FIGS. 1a and 1b-7.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1a and 1b-7. Design structure 990 may then proceed to a stage 995 where, for example, design structure 990: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a last metal line in electrical contact with an underlying device; and
   at least one staple structure in direct electrical contact with the last metal line, the at least one staple structure reducing electromigration issues in the last metal line, wherein
   the at least one staple structure is formed in a dielectric material, a plurality of vias and a trench spanning between the plurality of vias, and
   the plurality of vias and the trench are lined with a conductive liner and the plurality of vias and the trench are filled with a conductive material to form a conductive bar in direct electrical contact with the conductive liner in the vias.

2. The structure of claim 1, wherein the at least one staple structure is structured such that electrical current passing through the last metal line and also passes through the at least staple structure to reduce electromigration issues.

3. The structure of claim 1, wherein the plurality of vias is two vias in direct electrical contact with the last metal line and which are spaced apart less than a Blech length.

4. The structure of claim 1, wherein the at least one staple structure comprises:
a plurality of staggered staple structures in the dielectric material, in direct electrical contact with the at last metal line.

5. The structure of claim 1, wherein the last metal line is in electrical contact with a bipolar transistor and the at least one staple structure provides a blocking zone.

6. A structure comprising:
a last metal line in electrical contact with an underlying device; and
at least one staple structure in direct electrical contact with the last metal line, the at least one staple structure reducing electromigration issues in the last metal line, wherein
the at least one staple structure is formed in a dielectric material, a plurality of vias and a trench spanning between the plurality of vias, and
the plurality of vias and the trench are lined with tantalum, nitride or ruthenium, and then filled with copper material to form the at least one staple structure.

7. The structure of claim 6, further comprising a cap layer of SiN over the trench.

8. A structure comprising:
a last metal line in electrical contact with an underlying device; and
at least one staple structure in direct electrical contact with the last metal line, the at least one staple structure reducing electromigration issues in the last metal line, wherein the at least one staple structure comprises:
a plurality of vias in the dielectric material, a plurality of trenches in the dielectric material, each of which are in contact with at least two of the plurality of vias;
the plurality of vias and trenches are lined with a conductive liner;
the plurality of vias and trenches are filled with a conductive material over the conductive liner; and
the trenches are capped with a capping material.

9. The structure of claim 8, wherein:
the conductive liner is tantalum, nitride or ruthenium;
the conductive material is copper; and
the capping material is SiN.

* * * * *